(12) United States Patent
Roberts et al.

(10) Patent No.: US 8,193,655 B2
(45) Date of Patent: Jun. 5, 2012

(54) SYSTEM FOR CONVERTING OCEAN WAVE ENERGY TO ELECTRIC POWER

(76) Inventors: Allan Roberts, Buena Park, CA (US); Weixing Lu, Los Angeles, CA (US)

(*) Notice: Subject to any disclaimer, the term of this patent is extended or adjusted under 35 U.S.C. 154(b) by 0 days.

(21) Appl. No.: 13/044,781

(22) Filed: Mar. 10, 2011

(65) Prior Publication Data
US 2011/0215580 A1 Sep. 8, 2011

Related U.S. Application Data

(60) Provisional application No. 61/339,839, filed on Mar. 10, 2010.

(51) Int. Cl.
*F03B 13/12* (2006.01)
*H01L 1/00* (2006.01)
(52) U.S. Cl. .......................... 290/53; 310/309
(58) Field of Classification Search .................... 290/42, 290/53
See application file for complete search history.

(56) References Cited

U.S. PATENT DOCUMENTS

| | | | | |
|---|---|---|---|---|
| 5,126,614 | A * | 6/1992 | Fujita et al. | 310/323.12 |
| 5,512,795 | A * | 4/1996 | Epstein et al. | 310/339 |
| 7,034,432 | B1 * | 4/2006 | Pelrine et al. | 310/309 |
| 7,224,106 | B2 * | 5/2007 | Pei et al. | 310/311 |
| 7,368,862 | B2 * | 5/2008 | Pelrine et al. | 310/365 |
| 7,728,492 | B2 * | 6/2010 | Axelrod et al. | 310/357 |
| 7,816,797 | B2 * | 10/2010 | Nair | 290/42 |
| 7,906,861 | B2 * | 3/2011 | Guerrero et al. | 290/1 R |
| 7,977,852 | B2 * | 7/2011 | Ward et al. | 310/339 |
| 7,999,444 | B2 * | 8/2011 | Sunaga | 310/339 |
| 2007/0257490 | A1 * | 11/2007 | Kornbluh et al. | 290/53 |
| 2009/0152990 | A1 * | 6/2009 | Brown et al. | 310/339 |
| 2011/0031749 | A1 * | 2/2011 | Sapir et al. | 290/50 |

FOREIGN PATENT DOCUMENTS
CN 101629538 A * 1/2010
* cited by examiner

*Primary Examiner* — Joseph Waks
(74) *Attorney, Agent, or Firm* — Kristina M. Grasso, Esq. PLLC

(57) ABSTRACT

One embodiment of the present invention consists of a system of small, interconnected cubes, each containing interior walls made from a highly sensitive multi-layer piezoelectric material and each having heavy mass, such as stainless steel, inside the cube interior. An elastic material layer covers the heavy internal mass that is in contact with the piezoelectric cube walls. As the system moves with the water, the heavy mass inside each cube exerts varying inertial forces on the cube walls causing a piezoelectric current to be generated. However, the cell walls may also be constructed using commercially available piezoelectric materials. This approach is a second embodiment of the current invention and includes the same system design as the first embodiment except that the internal cubic cell walls are fabricated in a unique manner using commercially available piezoelectric materials, rather than the non-central symmetric LB poly-vinylidene fluoride (PVDF) multilayer piezoelectric material.

20 Claims, 15 Drawing Sheets

SYSTEM FOR CONVERTING OCEAN WAVE ENERGY TO ELECTRIC POWER

CROSS-REFERENCE TO RELATED APPLICATION(S)

The present application may include subject matter related to one or more of the following commonly-owned United States patent applications, each of which was filed on even date herewith, claims the benefit of, and is hereby incorporated herein by reference in its entirety: U.S. Provisional Patent No. 61/339,839 filed Mar. 10, 2010.

TECHNICAL FIELD

The present invention relates to energy generation. In particular, the present invention relates to generating energy from ocean wave motion.

BACKGROUND

Ocean waves possess very large amounts of kinetic energy of motion that goes almost entirely untapped. Estimates of wave energy potential indicate that it can provide 15-20 times more available energy per square meter than either wind or solar and for the California coastline this amounts to over 7 gigawatts. While there are currently many approaches to harvesting ocean wave energy, they generally employ large, high cost mechanical systems that are expensive to maintain, convert wave energy at low efficiency and pose numerous environmental problems.

Ocean wave energy possesses very high energy density and can provide 15-20 times more available energy per square meter than either wind or solar. Examples of state-of-the-art systems include turbine-type wave energy converters (WECs) and oscillating water columns (OWCs). The OWC operates much like a wind turbine via the principle of wave induced air pressurization and requires an anchoring system to keep the chamber steady for collection of air pressure generated by a wave driven OWC inside the chamber. The overtopping WEC works much like a hydroelectric dam. Waves roll into a collector which funnels the water into a hydro turbine. The turbines are coupled to generators which produce the electricity. The overtopping WEC has to be slack moored or fixed moored to the ocean bottom too. The float-type WEC operates with several different power take-off methods, but all of them involve many mechanical moving parts (e.g. a naturally buoyant float, hose pump, or hinged joint pump) and pose control problems because the wave height may exceed the WEC's stroke length (how far up and down the floater is permitted to move by design). The outcome could be damage to the WEC during a storm when wave heights are extreme. Both current turbine-type and float-type WECs use a generator to convert the kinetic energy to electricity that makes the system large, expensive, low in efficiency, and difficult to maintain. The California Commission Publication #CEC-500-2008-083 (November 2008) "Developing Wave Energy In Coastal California: Potential Socio-Economic and Environmental Effects" and "the Energy Innovation Institute & EPRI Report on Assessment Offshore Wave Energy Conversion Devices" (June 2004) represent comprehensive summaries and assessments of the state-of-the-art in ocean wave energy conversion devices. According to available studies and reports, the ocean wave energy harvesting systems currently being developed generally employ bulky, mechanical equipment that results in cost-inefficiencies, high maintenance, degradation of scenic ocean views and expensive construction. They can also pose a threat to sea navigation and disturb marine life.

SUMMARY

The present invention presents a new approach to converting ocean wave motion to electrical power. The approach is based on an adaptation of the piezoelectric effect, a well known property of certain materials to produce electrical power when they undergo strain or pressure. This property is ordinarily employed to produce only small amounts of current. For example, in devices such as contact microphones, the vibration from a musical instrument creates enough strain on a piezoelectric crystal to generate a small electric current. Based on recent breakthroughs in nanotechnology, new, low-cost, piezoelectric materials can now be fabricated or combined in multi-layer structures to create more efficient piezoelectric effects and be scaled up to create high power output.

The first embodiment of the present invention consists of a system of small, interconnected cubes, each containing interior walls made from a highly sensitive multi-layer piezoelectric material and each having heavy mass such as stainless steel inside the cube interior. An elastic material layer covers the heavy internal mass that is in contact with the piezoelectric cube walls. As the system moves with the water, the heavy mass inside each cube exerts varying inertial forces on the cube walls causing piezoelectric current to be generated. The rougher the sea or river motion, the more power is produced. The system can provide power to many types of waterborne sensors or other underwater devices attached to it.

In the first embodiment, each cube is small (about ½ inch on each side) and the cubes are wired together and assembled into a disk-shaped container having a diameter of about 3.5 inches. The disks are stacked together vertically and encapsulated in a highly durable, non-corrosive container that would incorporate an electrical circuit board and a rechargeable battery. The entire system takes the form of a cylinder with diameter of about 3.6 inches and height of about 3.2 inches weighing about 2 pounds. These dimensions permit system to fit within a standard A-sized battery compartment, allowing easy integration for some existing seaborne equipment. The electrical current produced via the piezoelectric material inside each cube would be additive and would be accumulated by circuitry to recharge the system's internal battery. The battery would supply continuous DC power to external sensors or other equipment.

The first embodiment of this invention creates the necessary nano-materials and uses them to construct small cell walls of each cube. When such cube cells float on the surface of ocean waves or move in river currents, the internal mass constantly shifts inside the cell in correspondence to the motion, creating strains on the piezoelectric cube cell walls. The stacked piezoelectric poly-cube device is small and inexpensive to produce. When thousands of them are wired together in a floating apparatus, like a fishing net (sea-net), the electric current is additive and provides a large power output.

This piezoelectric sea-net has virtually no mechanical moving parts and the system can be made as large or small as desired. Calculations indicate that a square sea-net of 100 feet on each side would contain 40,000 poly-cube devices and would continuously generate approximately 46 kilowatts of power under calm Sea State 2 conditions and about 4 megawatts under choppy Sea State 4 conditions. Such a sea-net can be connected to shore or floating platforms via an underwater electrical cable. The sea-net would float with a low profile and would mitigate some of the visual, environmental and safety impacts associated with other ocean wave energy devices.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

The invention description below refers to the accompanying drawings, of which.

DETAILED DESCRIPTION

Figure 1:
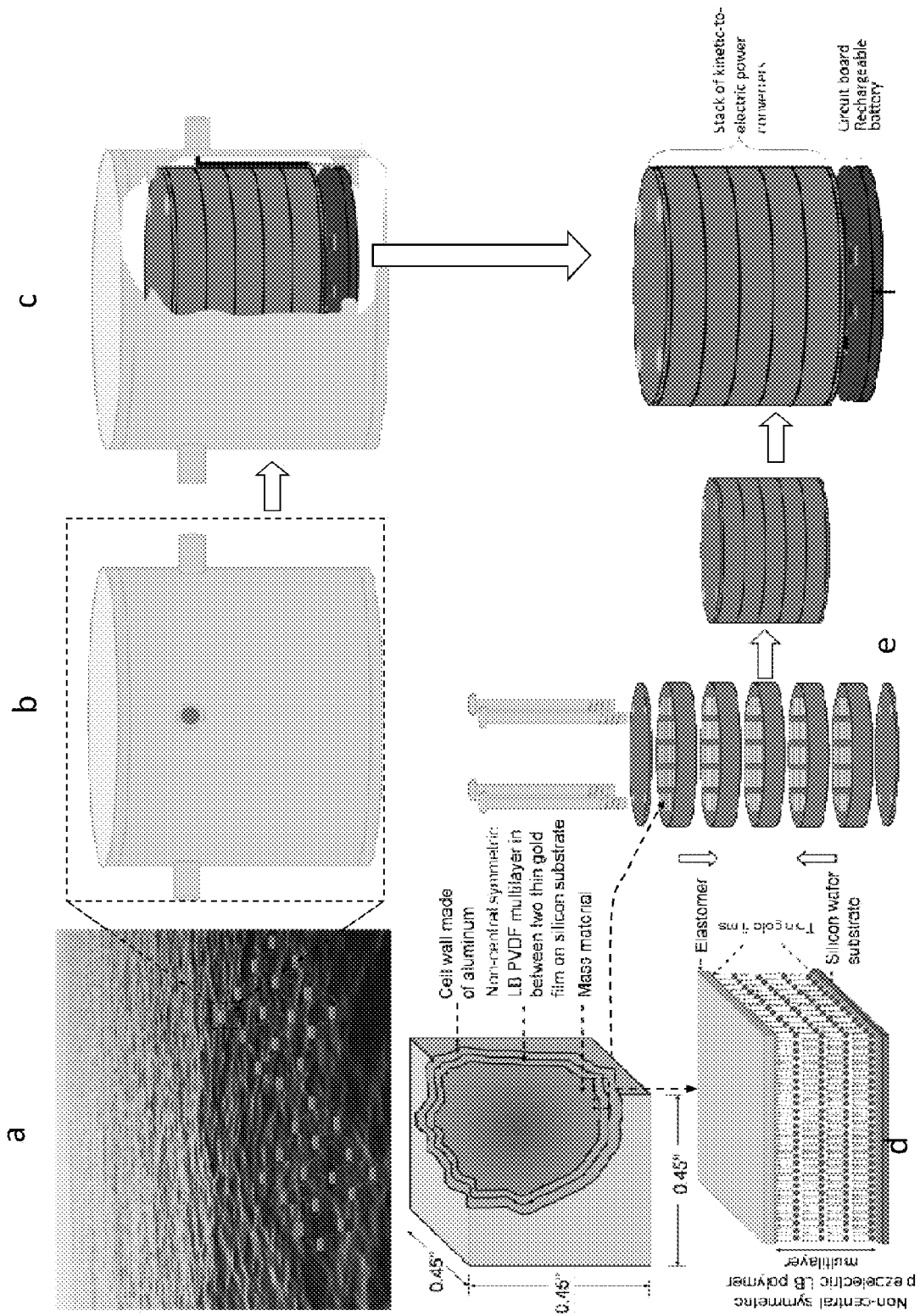
FIG. 1 is a schematic illustration of the present invention.

This detailed description presents a first embodiment of the present invention for converting hydrodynamic energy to electric power that overcomes the shortcomings of existing methods. FIG. 1 schematically illustrates the system and its application scenario. The system is designed to float on or under the surface of ocean waves or river currents and directly convert the naturally occurring kinetic hydrodynamic motion of the water to electric power without mechanical moving parts and without the need to be attached to the seabed. The proposed system is inexpensive to produce, flexible in size and simple to deploy. Design and fabrication of the system is made possible because of recent breakthroughs in nanotechnology, specifically the ability to fabricate nano-materials with highly efficient piezoelectric properties. By coupling these advances with its innovative design concepts, the first embodiment of the present invention provides an advanced and highly cost effective source of green, renewable electric power.

This approach makes the harvesting of large quantities of ocean wave energy feasible by avoiding the serious cost, environmental and safety drawbacks of other mechanical ocean wave systems and by providing a technology that is inexpensive to build and maintain, easily adaptable, and robust enough to remain operational for many years in the harshest of sea conditions. The first embodiment of the present invention is a potentially disruptive breakthrough technology that is highly scalable and could therefore provide both large and small amounts of power in many types of marine and non-marine applications, wherever a continuous energy of motion exists such as for shipboard electronics, ocean buoys, onboard sensors, emergency equipment and various airborne avionic devices. Scaled up to its maximum potential, the system can put ocean wave energy alongside solar and wind power as a valuable source of clean, renewable energy. Table 1 shows preliminary power output estimates of the Sea-Net system.

TABLE 1

Estimated power output of Sea-Net systems

| Sea-Net | | Sea State 2 | | Sea State 4 | |
| --- | --- | --- | --- | --- | --- |
| Size (Feet per side) | Number of Devices | Power output (Watts) | Annual production (MWh) | Power output (Watts) | Annual production (MWh) |
| 0.5 | 1 | 1.16 | 0.010 | 99.8 | 0.87 |
| 1.5 | 9 | 10.44 | 0.915 | 898.2 | 7.86 |
| 10 | 400 | 464 | 4.065 | 39,920.0 | 349.70 |
| 25 | 2,500 | 2900 | 25.404 | 249,500.0 | 2,185.62 |
| 75 | 22,500 | 26100 | 228.636 | 2,245,500.0 | 19,670.58 |
| 100 | 40,000 | 46400 | 406.464 | 3,992,000.0 | 34,969.92 |
| . | . | . | . | . | . |
| . | . | . | . | . | . |
| . | . | . | . | . | . |

Energy Problem Targeted

Ocean waves possess great amounts of kinetic energy of motion that goes almost entirely untapped. While there are currently many approaches for harvesting ocean wave energy, they generally consist of large mechanical devices that are very expensive to construct, operate and maintain. In addition, the current devices generate electrical power at low efficiencies while posing numerous environmental and safety problems. The first embodiment of the present invention is a new approach to the conversion of ocean wave kinetic energy to electric power that avoids the environmental, safety and cost disadvantages of the currently available systems. The first embodiment of the present invention can open the door to a large new source of renewable energy from oceans and rivers.

Innovations

The first embodiment of the present invention has the following advantages over current ocean wave energy technology:

Significantly increased kinetic-to-power conversion efficiency (>90% estimate) so that the proposed sea-net system cost-effectively harvests ocean and river hydrodynamic energy from the motion of the water in Sea States Code 2 and above to supply attached equipment or the power grid.

Considerably reduces the dimensions of the entire system making it highly scalable from small to large and able to be integrated into many varied individual systems for additional self-powered application, battery recharging, etc.

Notably increases system robustness and durability even in rough seas compared to mechanical systems so that the proposed system can withstand violent dynamic motion forces as from an unpredictable storm and require minimal life-cycle maintenance.

These advantages are made possible by the following innovations:

Use of advanced Langmuir-Blodgett deposition nanotechnology to construct optimal piezoelectric materials;

Use of a non-central symmetric LB PVDF multilayer for the piezoelectric cube walls;

Integration of a unique poly-cubic stack design with heavy mass such as stainless steel as the working mass for kinetic energy absorption; and Floating sea-net design that wires together and interconnects multiple system units allowing easy scalability and adaptability from small to large power projects.

All together, these innovations enhance the conversion efficiency from hydrodynamic energy to electricity while improving system robustness, compactness, compatibility, and cost-effectiveness. By integrating non-central symmetric LB PVDF multilayer piezoelectric material with a unique poly-cubic stack design that uses stainless steel as the kinetic energy absorber, the system of the present invention directly addresses the requirements for a highly efficient energy harvesting system. It dramatically enhances energy conversion efficiency by combining new technologies of piezoelectric polymers, MEMS fabrication and LB deposition while improving performance and robustness as required under harsh sea state conditions. The assembled sea-net system is designed to float on the sea surface and could be scaled up as large as desired in any shape desired so as to avoid the environmental and safety problems of current mechanical ocean wave energy systems.

The materials needed to construct the system are created using nanotechnology methods, including Langmuir-Blodgett (LB) deposition, to assemble highly efficient materials. The first embodiment of the present invention design for the system includes (1) constructing a non-central symmetric Langmuir-Blodgett (LB) poly-vinylidene fluoride (PVDF) multilayer piezoelectric material; (2) using the piezoelectric material to form the cube walls in a stack of cubic cells with a heavy mass such as stainless steel as the working mass inside each cubic cell that absorbs the kinetic energy from the hydrodynamic motion and transmits it to the piezoelectric walls; (3) inserting a flexible elastomeric layer of polydimethylsiloxane (PDMS) in the gap between the heavy stainless steel mass and the piezoelectric layers of the cell walls to protect them from any striking forces on the LB multilayer; and (4) assembling a large-scale fishnet-type system (sea-net) containing many of the piezoelectric energy conversion devices as illustrated in FIG. 1.

FIG. 1 illustrates the application scenario of a sea-net system with (a) assembled power units; (b) an assembled power unit including floatable protection case made from lightweight material; (c) the cut-away of an assembled unit showing the core device; (d) a single device including protection case, poly-cubic stack, electronic circuit board and optional rechargeable battery; (e) zoom in cut-away of an individual mass material-filled kinetic-to-electric conversion cube showing the inside wall made of the non-central symmetric Langmuir-Blodgett (LB) poly-vinylidene fluoride (PVDF) multilayer material; (f) the zoom in sandwich structure of the non-central symmetric LB PVDF multiplayer.

Each multi-cell device has a diameter of approximately 3.6 inches and a thickness of approximately 3.2 inches. The devices are each encapsulated in a floatable casing and wired together in a sea-net apparatus. As the proposed sea-net moves with the sea waves, the acceleration of the heavy steel mass inside each cubic cell effectively creates a setback pressure (inertia force) that in turn applies itself on the inside walls of the cube. Each cube wall is specially fabricated with a non-central symmetric LB PVDF multilayer piezoelectric structure to efficiently generate electrical power from the applied strain pressures.

Due to the high density of the heavy mass (stainless steel) and the high elasticity of the elastomeric layer, the dynamic force of the moving mass converts to effective pressure on the interior walls of each cubic cell and since the friction between the heavy mass and the wall is very small (due to high elasticity of the elastomeric material) the transfer of pressure takes place with high efficiency. Since there are virtually no mechanical moving parts, the assembled device, as shown in FIG. 1d, is easy to fabricate, trouble-free, highly durable and very scalable (from a few $cm^3$ to many $m^3$). The piezoelectric polymer PVDF is a much softer piezoelectric materials than inorganic crystals and ceramics such as quartz and lead zirconate titanate PZT, and hence possesses higher sensitivity to low pressure, which is very appropriate for low sea states (code 2 to 4) and compact design. This sensitivity is highly enhanced by introduction of the properly oriented and uniform non-central symmetric LB PVDF multilayer, enabling the device to increase its power output by at least two orders of magnitude. The unique poly-cubic stack design further enhances the kinetic-to-electric efficiency by increasing the surface area of the non-central symmetric LB PVDF multilayer and allowing the system to harvest wave kinetic energy from all directions, thereby enhancing the harvesting efficiency as well.

In contrast to using one large cubic cell for the entire system, which may comprise another embodiment of the present invention, the poly-cubic stack design is advantageous in that it (1) uniformly disperses the high pressure to every cell wall, resulting in an improvement in system performance and durability even in the event of harsh sea conditions; (2) significantly increases the surface area of the piezoelectric material to gain high kinetic-to-electrical conversion efficiency; and (3) effectively tunes the output voltage and current for charging an optional rechargeable battery (needed in some stand-alone applications) via a combination of series and parallel connections of the individual piezoelectric cell walls. Because of the novel combination of the non-central symmetric LB PVDF multilayer, the heavy mass and the poly-cubic stack design, the characteristics of a single assembled system as shown in FIG. 1d is approximately as follows: diameter $\leq 3.6$ inches; thickness $\leq 3.2$ inches; weight <2 lbs; and conversion efficiency >90%. The use of a multilayer nano structure of piezoelectric materials in an optimized configuration within the internal structure of the device results in power densities at least two orders of magnitude higher than current technologies and enhances the conversion efficiency of the device from standard ocean wave motion kinetic energy into electricity, while also improving system robustness, compactness, compatibility, and cost-efficiency.

The device of the present invention may be assembled to form a desired shape for the sea-net system without mechanical moving parts, and the system can be made as large or small as desired. Calculations indicate that a square sea-net of 100 feet on each side would contain 40,000 system devices and would continuously generate approximately 46 kilowatts of power under relatively calm Sea State 2 conditions. Under Sea State 4 conditions, the same sea-net would generate almost 4 megawatts (see Table 1). Such a sea-net floating coast, for example, could be located in a so called ocean wave farm, and connected to shore via an underwater electrical cable. The sea-net could be scaled up as large as desired, and in any shape desired, so as to avoid the environmental and safety problems associated with other ocean wave energy devices. Calculations point to the potential to achieve very low costs per kilowatt hour in large deployments.

The size-scalable system can be assembled to form a large scale hydrodynamic wave energy system as described, but can also be adapted to individual systems in oceans of rivers for self-power purpose such as deployable powered ocean buoys, marine systems for tracking marine mammal mitigation, beacon markers, portable electronics, shipboard electronics and emergency equipment. In fact, a wide range of applications will benefit from the compact and highly efficient kinetic-to-electric conversion system.

Market Connection

Commercial Applications: In addition to its use in large sea-nets to provide grid power, the first embodiment of the present invention will also find myriad applications in small electronic systems used in communications and sensors which currently rely on battery power. This opens up the possibility of achieving significantly longer battery lifetimes, and reducing battery size, especially in wireless sensor network systems at sea where kinetic energy of motion is available for harvesting. As such, the system has significant commercial applications, for example, in shipboard electronics, ocean buoys and other marine systems, seaborne emergency equipment and other applications.

Military Applications: Military uses may include miniaturized sensors equipped with electronic components for self-powered wireless data transmission. System components are capable of being used for ruggedized construction in many shipboard, battlefield and aircraft scenarios.

Evaluation of Ocean Wave Energy Potential

Figure 2:
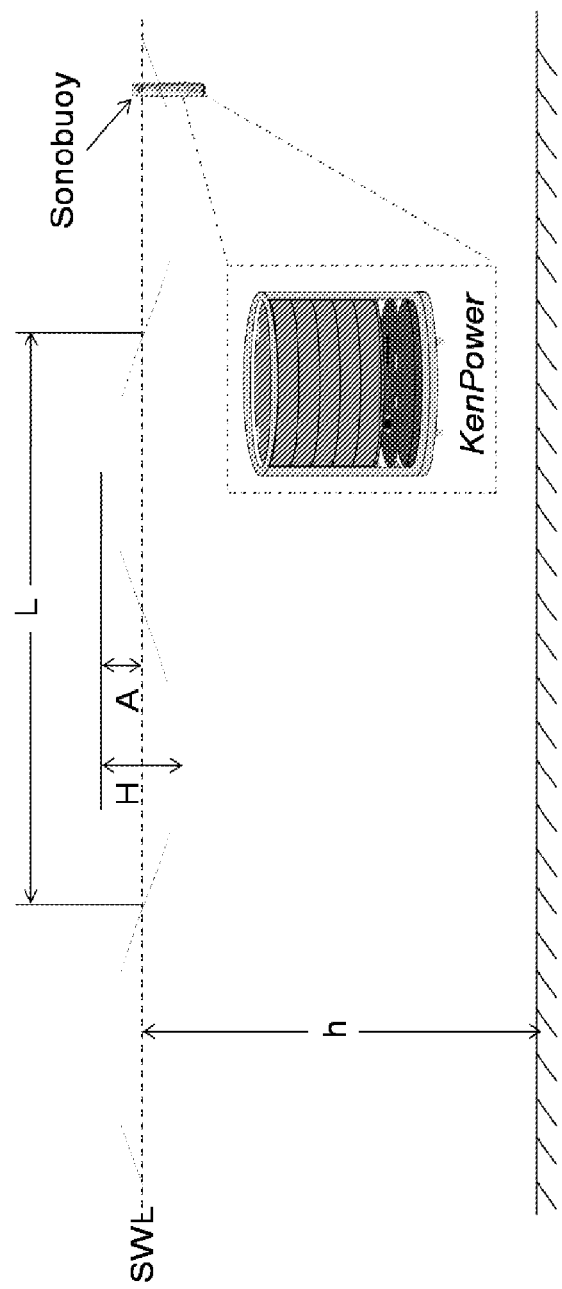
FIG. 2 summarizes a commonly used wave energy nomenclature that is applied to a sonobuoy.

Ocean energy comes in a variety of forms such as geothermal vents, and ocean currents and waves. Among them, ocean waves are the most appropriate energy source to harvest for renewable energy applications, because ocean waves possess very high energy density and can provides 15-20 times more available energy per square meter than either wind or solar. Most importantly, waves are a regular source of power with an intensity that can be accurately predicted several days before their arrival, more predictable than wind or solar energy. Calculating the forces acting on the first embodiment of the present invention and the available wave power are important for the design process of the kinetic-to-electric converter. Both must be known in order to size a kinetic-to-electric converter according to the desired energy output. Table 2 and FIG. 2 summarize a commonly used wave energy nomenclature that is applied to a sonobuoy and is also used in this example.

TABLE 2

Wave nomenclature

| Name | Description | Unit/Value |
| --- | --- | --- |
| SWL | Mean sea water level (surface) | |
| $E_{density}$ | Wave energy density | $J/m^2$ |
| $E_{wavefront}$ | Energy per meter wave front | $J/m$ |
| $P_{density}$ | Wave power density | $W/m^2$ |
| $P_{wavefront}$ | Power per meter wave front | $W/m$ |
| Π | Depth below SWL | M |
| Ω | Wave frenquency | Rad/s |
| λ or L | Wavelength = $gT^2/(2\pi)$ | M |
| $\rho_{water}$ | Sea water density | $1000\ kg/m^3$ |
| G | Gravitational constant | $8.81\ m/s^2$ |
| A | Wave amplitude | M |
| H | Wave height | M |
| T | Wave period | S |
| C | Celerity (wave front velocity) | m/s |

The energy density ($E_{density}$) of a wave is the mean energy flux crossing a vertical plane parallel to a wave's crest. The energy per wave period is the wave's power ($P_{density}$) and may be found by dividing the energy density by the wave period. $E_{density}$ and $P_{density}$ may be expressed as follows:

$$E_{density} = \rho_{water} g H^2/8 = \rho_{water} g A^2/2 \tag{1}$$

$$P_{density} = E_{density}/T = \rho_{water} g H^2/(8T) = \rho_{water} g A^2/2T \tag{2}$$

If the system is placed underwater, the wave power at the operation depth must be known. In general, the wave power below sea level decays exponentially by $-2\pi d/\lambda$ where d is the depth below SWL. This property is valid for waves in water with depths greater than $\lambda/2$.

$$E(d) = E(SWL) \cdot e^{-2\pi d/\lambda} \tag{3}$$

The following is an evaluation of the energy and power densities when the sea wave is at the situation of sea state code 2. For code 2, the H and T are about ~0.5 m and ~0.2 sec. respectively. Then there are the energy and power densities of about 27.8 $J/m^2$ and 15.31 $W/m^2$ respectively based on the equation (1) and (2). Suppose the size of a single cubic cell of the system kinetic-to-electrical poly-cubic converter is about 1 $cm^3$ and that the buoy moves with the wave on the SWL, then the energy and power densities within this volume will be about 0.0042 J and 0.002 W. The size of the entire kinetic-to-electrical poly-cubic converter device is about 3.6 inches in diameter and 3.2 inches in thickness so that it can contain about 105 or more 1 $cm^3$ cells. Since the device is a point absorber or buoy-type system, it can harvest energy from all directions at one point in the ocean, so the potential power that may be harvested is about 6×105×0.002=1.26 W. Following the same evaluation process, the device of the present invention would produce a potential power density at sea state code 4 to harvest about 110.88 W. From these calculations, it is apparent that the wave energy in sea state codes 2 to 4 is rich enough to be harvested for renewable power generation.

Heavy Mass (Such as Stainless Steel) and Conversion of Setback Force to Pressure The first embodiment of the present invention presents a unique poly-cubic stack design with a stainless steel cube as the kinetic energy absorber inside each cell. The system uses a non-central symmetric Langmuir-Blodgett (LB) poly vinylidene fluoride (PVDF) multilayer as the kinetic-to-electrical conversion material to approach high efficiency. Stainless steel is used as the working mass inside each cell because it has high density (8 $g/cm^3$) and is non-hazardous. High density provides high efficiency to convert the dynamic movement forces to effective pressure on the walls of the cell. If a cube with capacity of 0.3 inches×0.3 inches×0.3 inches=0.027 cubic inches (442.45 mm³) is filled with working mass and accelerated perpendicular to the inside wall due to its movement with a wave, the effective pressure on the inside wall may be expressed as $P=F_s/A=|ma(t)|/A=1.44$ grams×a(t)/0.58 cm²=25.08a(t)(N/m²). Since the cube moves with the sea wave, its movement can be treated as a simple harmonic motion that may be expressed as y=A cos(ωt), where y is the position and c is frequency. The T, A, and ω for sea state code 2 is about 2.75 sec., 0.2 m, and 2.28 rad/s respectively. Hence, y=2.21 cos(2.28t), and the absolute value of acceleration a is about a=1.04 cos(2.28t). Therefore, the pressure applied on the inside wall will be P=25.08 cos (2.28t) (N/m²). It follows that the setback forces may be effectively converted to pressures varying from −25.08N/m² to 43N/m² which is within the effective range of a low pressure sensitive piezoelectric material, such as the proposed non-central symmetric LB PVDF multilayer piezoelectric materials. Given these pressure values, the system device will provide ample amounts of current, voltage and wattage.

Piezoelectric Polymers

The use of piezoelectric materials yields significant advantages for power supply systems. The energy density achievable with piezoelectric devices is potentially greater than that possible with electrostatic or electromagnetic devices. Since piezoelectric materials convert mechanical energy into electrical energy via strain in the piezoelectric material, they lend themselves to devices that operate by bending or flexing which brings significant design advantages.

Piezoelectricity is a property of many non-central symmetric ceramics, polymers and various biological systems. The properties of organic polymers such as PVDF are so different in comparison to inorganic ceramic materials such as PZT (see Table 3) that they are uniquely qualified to fill niche areas where single crystals and ceramics are incapable of performing as effectively. As noted in Table 2, the piezoelectric strain constant ($d_{31}$) for the PVDF polymer is lower than that of the ceramic. However, piezoelectric polymers have much higher piezoelectric stress constants ($g_{31}$) indicating that they are much better kinetic-to-electric converters than ceramics. In addition to their high strength and high impact resistance, piezoelectric polymeric materials also offer the advantage of processing flexibility because they are lightweight, tough, readily manufactured into large areas, and can be cut and formed into complex shapes. Other notable features of polymers are low dielectric constant, low elastic stiffness, and low density, which result in high voltage sensitivity (excellent sensor characteristic), and low acoustic and mechanical impedance (crucial for medical and underwater applications). Polymers also typically possess a high dielectric breakdown and high operating field strength, which means that they can withstand much higher driving fields than ceramics. Polymers offer the ability to pattern electrodes on the film surface, and pole only selected regions. Based on these features, piezoelectric polymers possess their own established area for technical applications and useful device configurations. The system uses the piezoelectric polymer PVDF as the building block materials for the kinetic-to-power conversion application.

TABLE 3

Property comparison of standard piezoelectric polymer and ceramic materials

| Piezoelectric Materials | $d_{31}{}^a$ (pm/V) | $g_{31}{}^a$ (mV-m/N) | $k_{31}$ | Salient Feature |
|---|---|---|---|---|
| Polyvinylidene-fluoride (PVDF) | 28 | 240 | 0.12 | Flexible, lightweight, low acoustic and mechanical impedance |
| Lead Zirconium Titanate (PZT) | 175 | 11 | 0.34 | Brittle, heavy, toxic |

$^a$Values shown are absolute values of constants.

Polymers possess piezoelectricity only when they have four critical elements, regardless of morphology. As summarized by Broadhurst and Davis, these essential elements are: (1) the presence of permanent molecular dipoles; (2) the ability to orient or align the molecular dipoles; (3) the ability to sustain the dipole alignment once it is achieved; and (4) the ability of the material to undergo large strains when mechanically stressed. The normal PVDF polymers meet the critical elements (1) and (2). In order to render them piezoelectricity they must be a non-central symmetric polar crystal or have a polar crystalline phase. Usually a PVDF polymer cannot form a single crystal but forms a mixed polar crystalline phase and amorphous phase. The morphology of such polymers consists of crystallites dispersed within amorphous regions as shown in FIG. 3(a). Stretching and electric field poling will initiate the PVDF film piezoelectricity. Stretching the polymer essentially aligns the amorphous strands in the film plane as shown in FIG. 3(b) and facilitates uniform rotation of the crystallites by an electric field. Depending on whether stretching is uniaxial or biaxial, the electrical and mechanical properties (and therefore the transduction response), are either highly anisotropic or isotropic in the plane of the polymer sheet. Electrical poling is accomplished by applying an electric field across the thickness of the polymer as depicted in FIG. 3(c). The higher the degree of crystalline structure that PVDF possesses, the higher the amount of piezoelectricity that PVDF presents. Although PVDF is much better than common inorganic piezoelectric materials, its degree of crystalline structure is still relatively low, resulting in low piezoelectricity. Therefore, the first embodiment of the present invention presents a non-central symmetric LB PVDF multilayer using Langmuir-Blodgett technology. This multilayer is similar to a single crystal structure as shown in FIG. 3(c) that possess all four critical elements as discussed in the last paragraph. The thickness, e.g.: how many layers, is controllable and can reach sufficient size for the film to achieve a high piezoelectric value, estimated at 2 orders of magnitude higher than common PVDF materials. This non-central symmetric layer is the best materials for the development of the new system.

Figure 3:
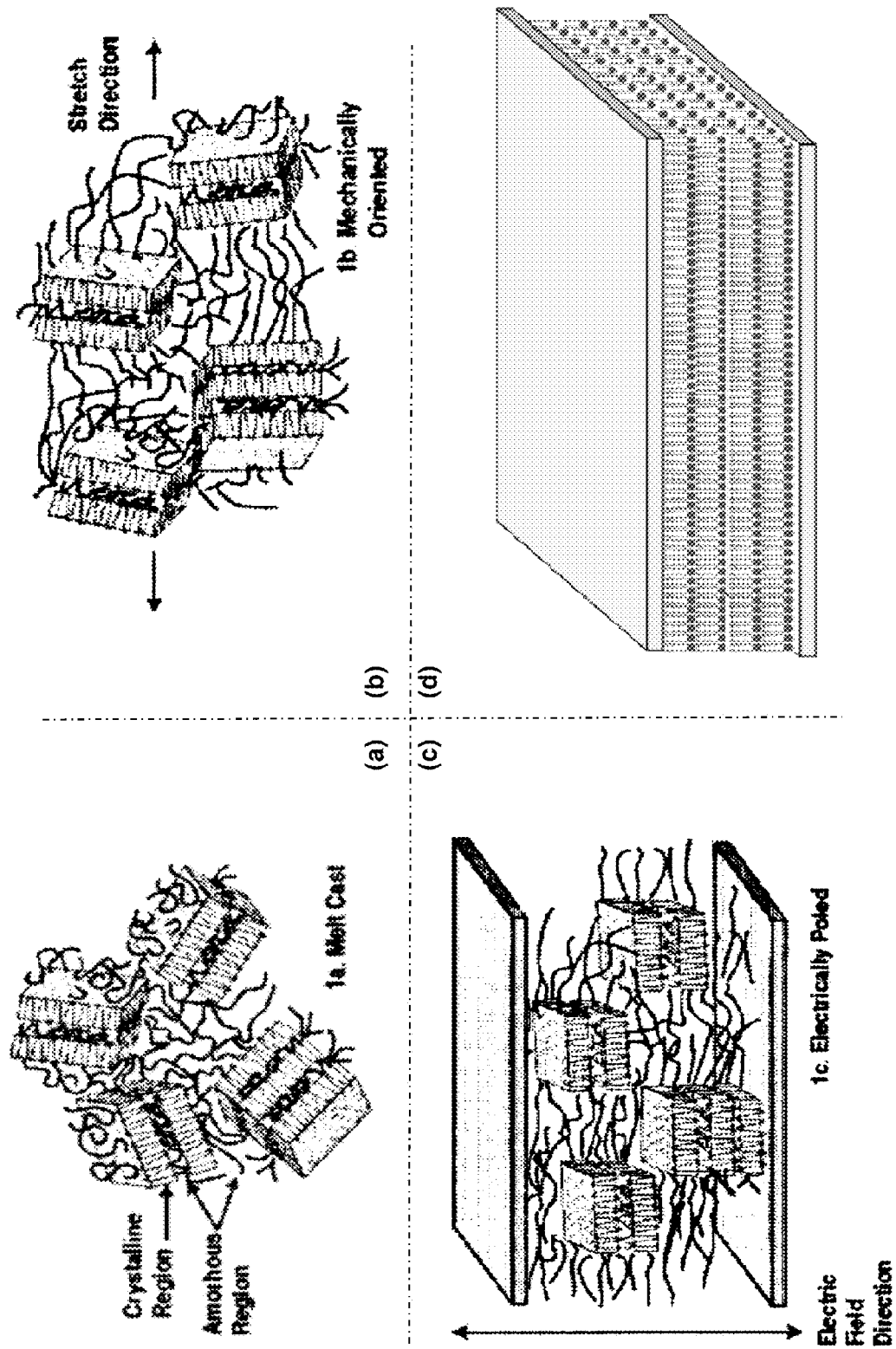
FIG. 3 is a schematic illustration showing random stacks of amorphous and crystal lamellae in the PVDF polymer and the proposed non-central symmetric LB PVDF multilayer.

FIG. 3 is a schematic illustration showing random stacks of amorphous and crystal lamellae in the PVDF polymer and the proposed non-central symmetric LB PVDF multilayer. (a) represents the morphology after the film is melted and cast; (b) is after orientation of the film by mechanical stretching; (c) is after depositing metal electrodes and poling through the film thickness.

Non-Central Symmetric Langmuir-Blodgett PVDF Multilayer

The asymmetric alignment of PVDF polar molecules within the multilayer film is essential for the enhancement of second-order non-linear physical phenomena such as piezoelectricity and pyroelectricity. Langmuir-Blodgett (LB) and self-assembly (SA) technologies provide possible approaches for building up such non-central symmetric structures in a bottom-up manner that is adaptable for the fabrication of miniaturized devices. However, it is often difficult to maintain a constant degree of asymmetric molecular alignment over many layers of an LB multilayer film. This problem is believed to be attributable to the tendency of polar molecules to align in an anti-parallel manner or to relax to a symmetric arrangement after deposition. In contrast, creation of an SA non-central symmetric multilayer would be more stable for maintaining a constant degree of asymmetric molecular alignment because the formation process of the SA structure is a spontaneous thermodynamic process. However, it is very difficult to properly control this process to assemble the structure.

The first embodiment of the present invention uses a hybrid technology of LB and SA to assemble stable, non-central symmetric multilayer structures. This new hybrid technology can form the structure in a controlled and engineered manner while the stability is maintained.

Figure 4:
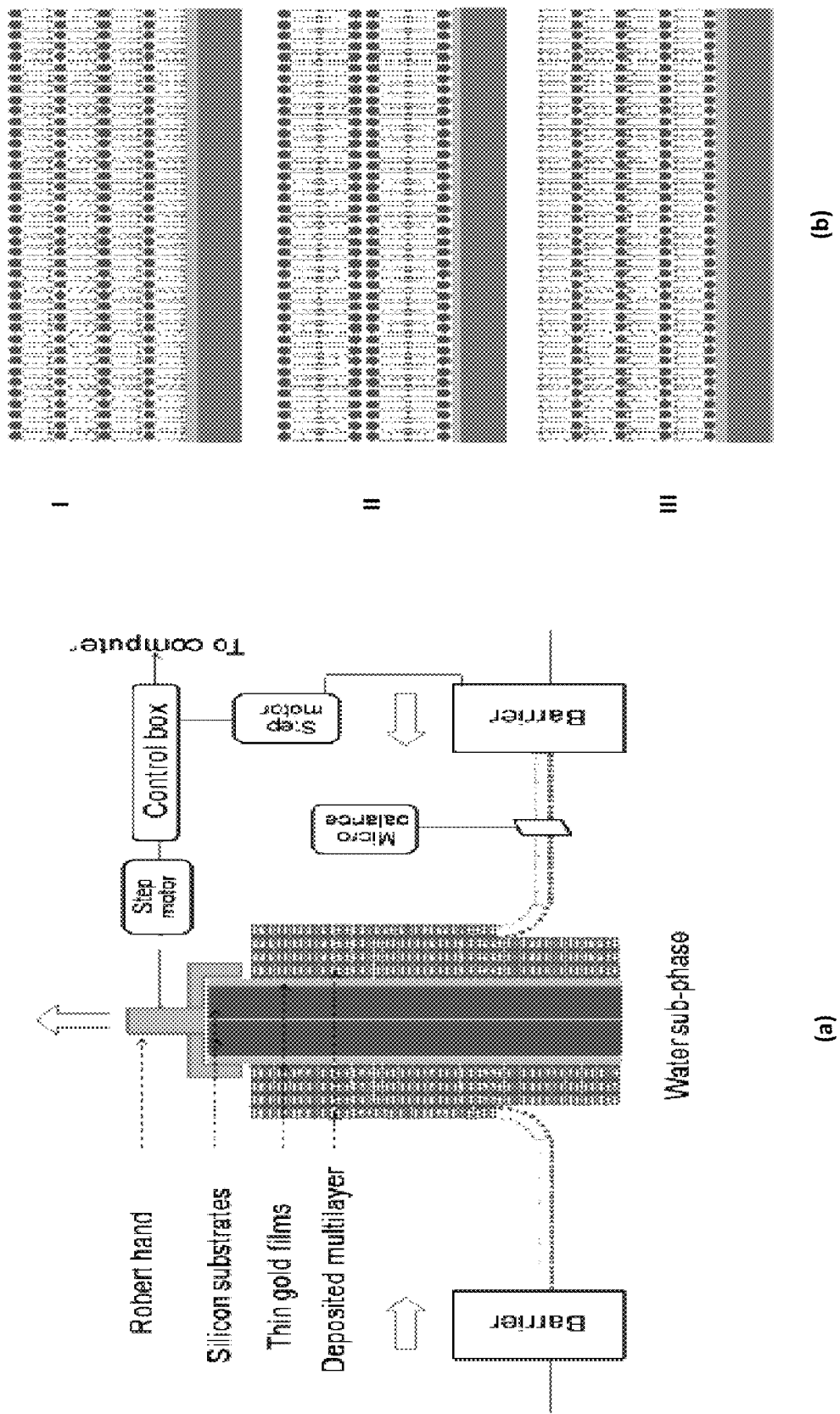
FIG. 4 is a schematic illustration showing a computer controllable Langmuir-Blodgett trough system and deposition of successive multi-layers and Langmuir-Blodgett film deposition modes (I) X-type, (II) Y-type, and (III) Z-type.

LB films are formed by the successive deposition of a series of monolayers of one or more types of amphiphilic molecules initially spread at the interface between water and air. They usually consist of a regular planar array of molecular layers having a well-defined and predetermined thickness (FIG. 4). Their properties have made them of interest to physicists, electronic engineers, chemists and biologists. The LB apparatus includes a Langmuir trough with a dipping device to lower or raise the substrate through the gas-liquid interface, an automated movable barrier which moves during the deposition process in order to maintain a controlled surface pressure (FIG. 4a), and a surface pressure sensor that controls the movable barrier.

Three modes of LB film deposition are possible. These are termed X-, Y-, and Z-type, as illustrated in FIG. 4. The vast majority of materials deposit in the Y-type mode (FIG. 4(I)), where material is transferred on both up- and down-strokes of the substrate, resulting in a structure in which the molecules are packed in a head-to-head and tail-to-tail sequence. Y-type structures containing an even number of monolayers are, of course, centrosymmetric and hence cannot be piezoelectric. X-type deposition (FIG. 4(II)) is the situation where material is transferred to the substrate only on the down-stroke. Finally, Z-type deposition (FIG. 4(III)) refers to transfer only on the up-stroke. It is apparent from FIG. 4 that both X- and Z-type depositions produce noncentrosymmetric polar structures, which should exhibit piezoelectric effects. However, these two types are not energetically favorable and the molecules will undergo rearrangement. The first embodiment of the present invention uses the Z-type structure and keeps the structure stable by introducing an SA reaction function group between layers.

FIG. 4 is a schematic illustration showing (a) a computer controllable Langmuir-Blodgett trough system and deposition of successive multi-layers; (b) Langmuir-Blodgett film deposition modes (I) X-type, (II) Y-type, and (III) Z-type.

The non-central symmetric multilayer will transfer onto a gold electrode by a series of LB-SA processes. The PVDF molecules are modified by a thiol group before the LB-SA deposition. Then a Z-type multilayer is formed by up-stroke dipping multiple times. A fixed drying time is strictly maintained before each layer's transition so that the dehydration can create strong bonding between layers.

Figure 5:
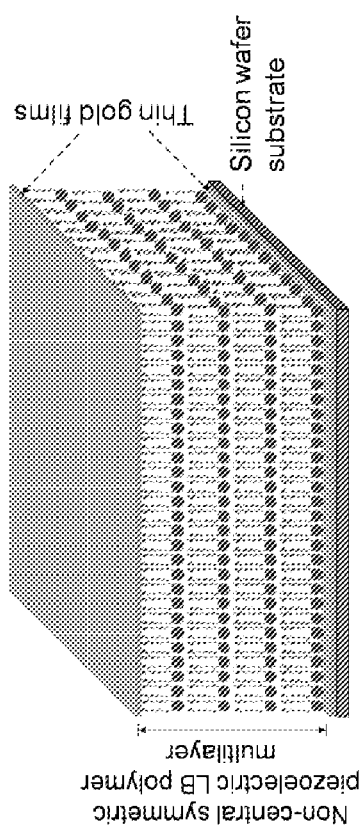
FIG. 5 is a proposed sandwich device used for the development of the system showing the LB PVDF multilayer in between two gold electrodes on a silicon wafer substrate.

PVDF molecules are spread onto the air/water interface to form a uniform monolayer with the required structure using the computer controlled barriers. As shown in FIG. 5, the monolayer is transferred to the gold electrode on a silicon wafer using Z type deposition. After drying for a few minutes to eliminate water (dehydration), the molecules on the gold surface form a strong covalent bond due to the thiol group, hence the inter monolayer structure is locked. By repeating the process many times, a non-central symmetric multilayer is obtained on the designed gold electrodes. After thermal evaporation or sputtering of gold film on the top of the deposited multilayer a sandwich-like structure is obtained and ready for use in the first embodiment of the present invention. FIG. 5 is a proposed sandwich device used for the development of the system showing the LB PVDF multilayer in between two gold electrodes on a silicon wafer substrate.

Design and Fabrication

Figure 6:
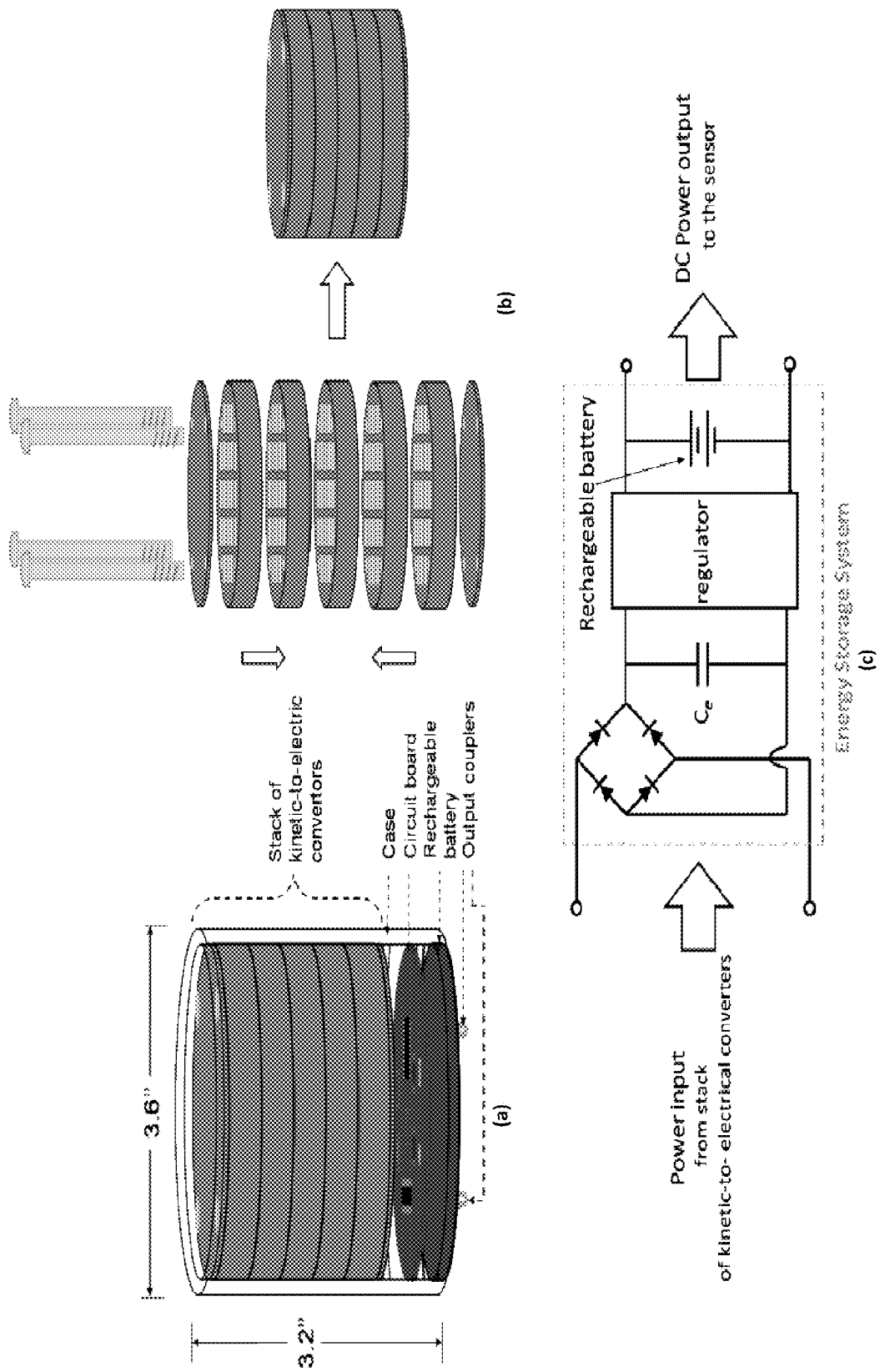
FIG. 6 illustrates a first embodiment of the present invention.

The first embodiment of the present invention illustrated in FIG. 6(a), consists of a protection case made of light materials such as porous polymer, a stack of kinetic-to-electric converters with a 3-dimensional poly-cubic array structure, a regulation circuit board, and a lithium ion rechargeable battery with sufficient output power and voltage to sustain the individual self-powered system. Five identical discs, each containing 21 identical cubic converters constructed with LB PVDF interior walls and filled with a heavy mass, are stacked up and assembled with a top and bottom cover using screws as shown in FIG. 6(b) to form a stack of converters. AC power from the stack is input to a circuit board to regulate and smooth the output DC voltage and current for the rechargeable battery. FIG. 6(c) shows the basic circuit diagram with necessary electronic components. The circuit board is designed and fabricated using electronic components and rechargeable batteries. The optimal parameters of the device, such as the size of the each cube, the thickness of the multilayer, number of discs, the wiring of the converters, the MEMS fabrication and LB deposition process, are designed to maximize energy harvesting efficiency and optimize the output voltage and current while minimizing system size. Analytic optimization is combined with numeric simulation in MATLAB and with available specialized software simulators. Based on the simulation, the design and fabrication of an optimal cube and poly-cubic array for assembly of the device is obtained.

Figure 7:
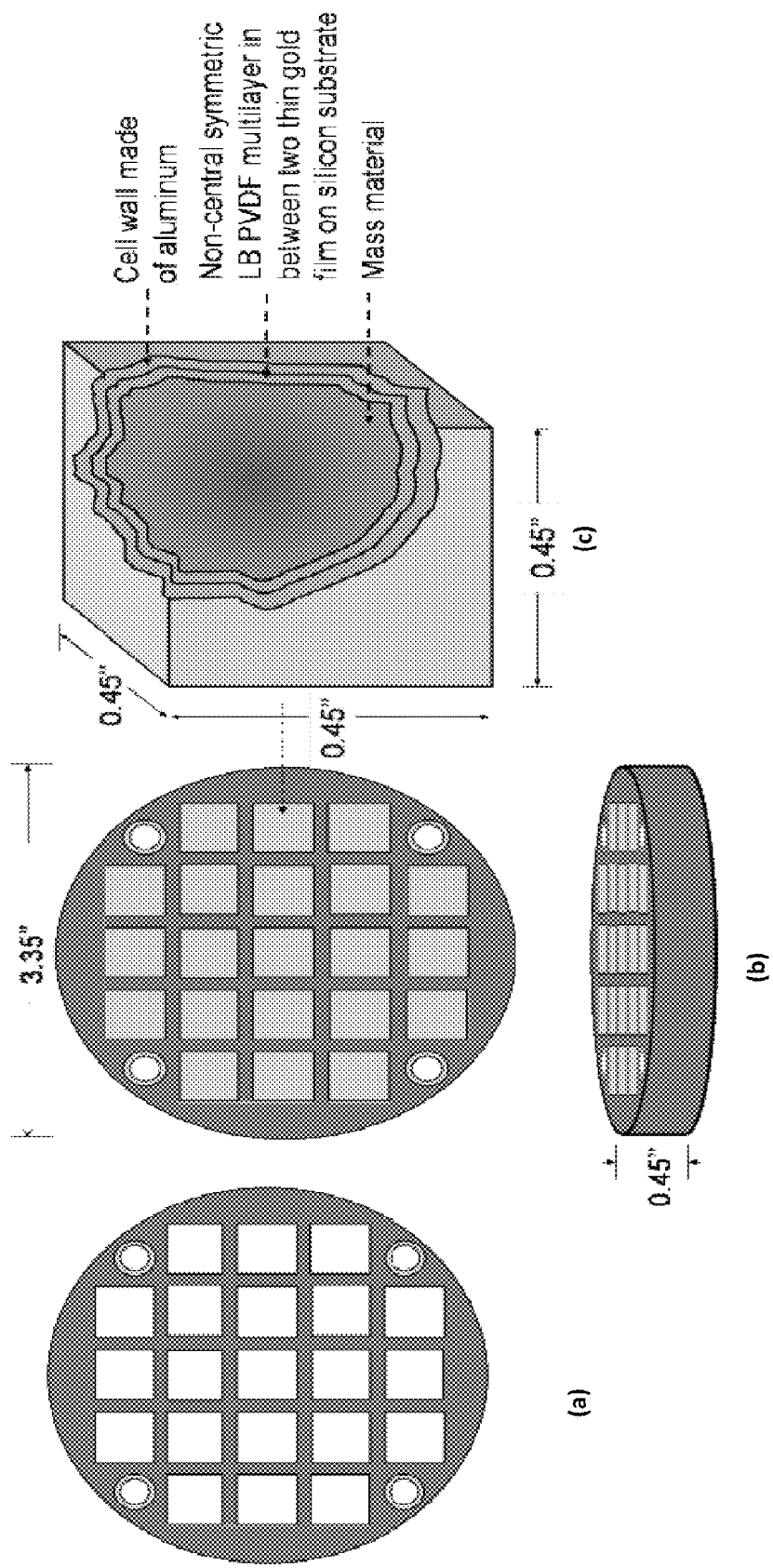
FIG. 7 illustrates the predesigned disc frame made of aluminum or plastic with 21 square holes and 4 screws through holes, the size of the disc with inserted cubic converters, and the detailed structure of the cubic converter.

In contrast to using one large cubic cell for the entire system, the poly-cubic stack design (1) uniformly disperses the high pressure to every cell wall, resulting in an improvement in system performance and durability even in the event of harsh storms; (2) significantly increases the surface area of piezoelectric material to gain high kinetic-to-electrical conversion efficiency; and (3) effectively tunes the output voltage and current for charging a rechargeable battery via a combination of series and parallel connections of the individual piezoelectric cube walls. These advantages render the first embodiment of the present invention able to harvest the necessary power from ocean waves and to be adjustable for optimal output voltage and current for the given power requirements. FIG. 7 illustrates the predesigned disc frame made of aluminum or plastic with 21 square holes and 4 screws through holes (FIG. 7(a)), the size of the disc with inserted cubic converters, and the detailed structure of the cubic converter (FIG. 7(c)).

Figure 8:
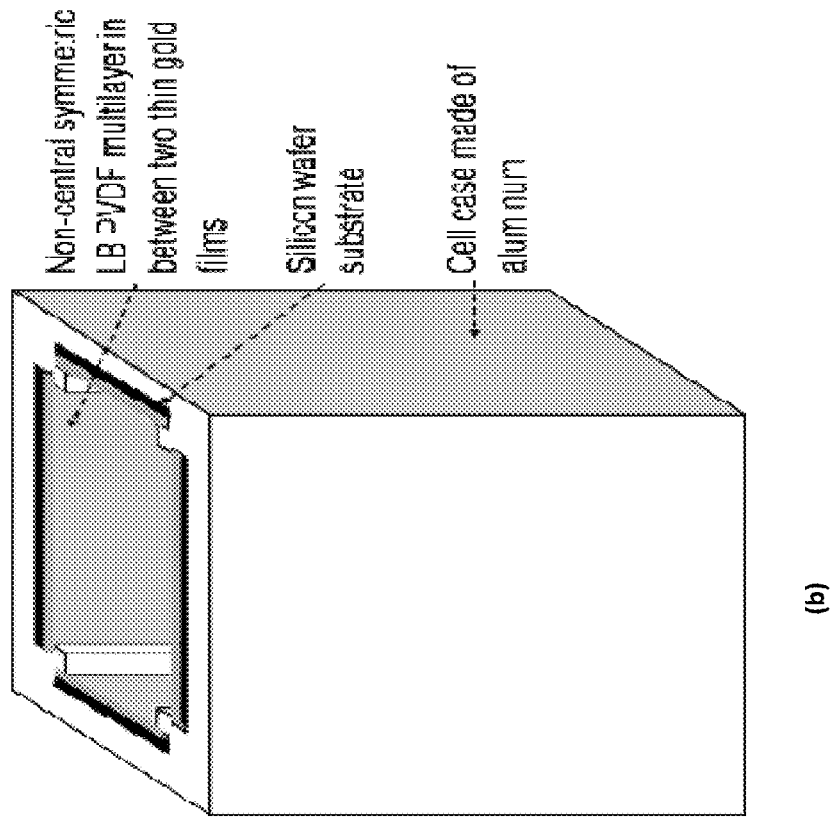
FIG. 8 illustrates the swallow-tailed grooves for holding the sandwich devices and the structure of the cubic cell after inserting four sandwich devices as inside sensing walls.
Figure 8:
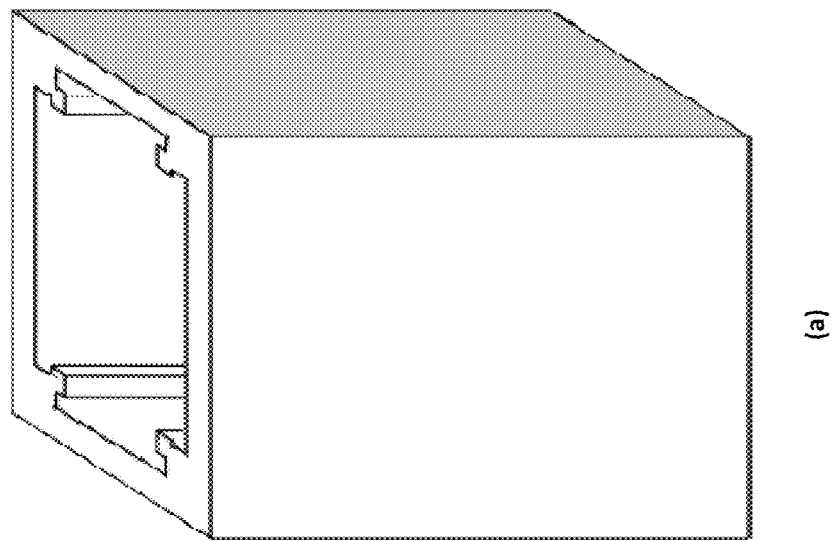

The cubic cell is made of a light material like porous polymer with swallow-tailed grooves for holding the sandwich devices as shown in FIG. 8(a). FIG. 8(b) illustrates the structure of the cubic cell after inserting four sandwich devices as inside sensing walls.

Figure 9:
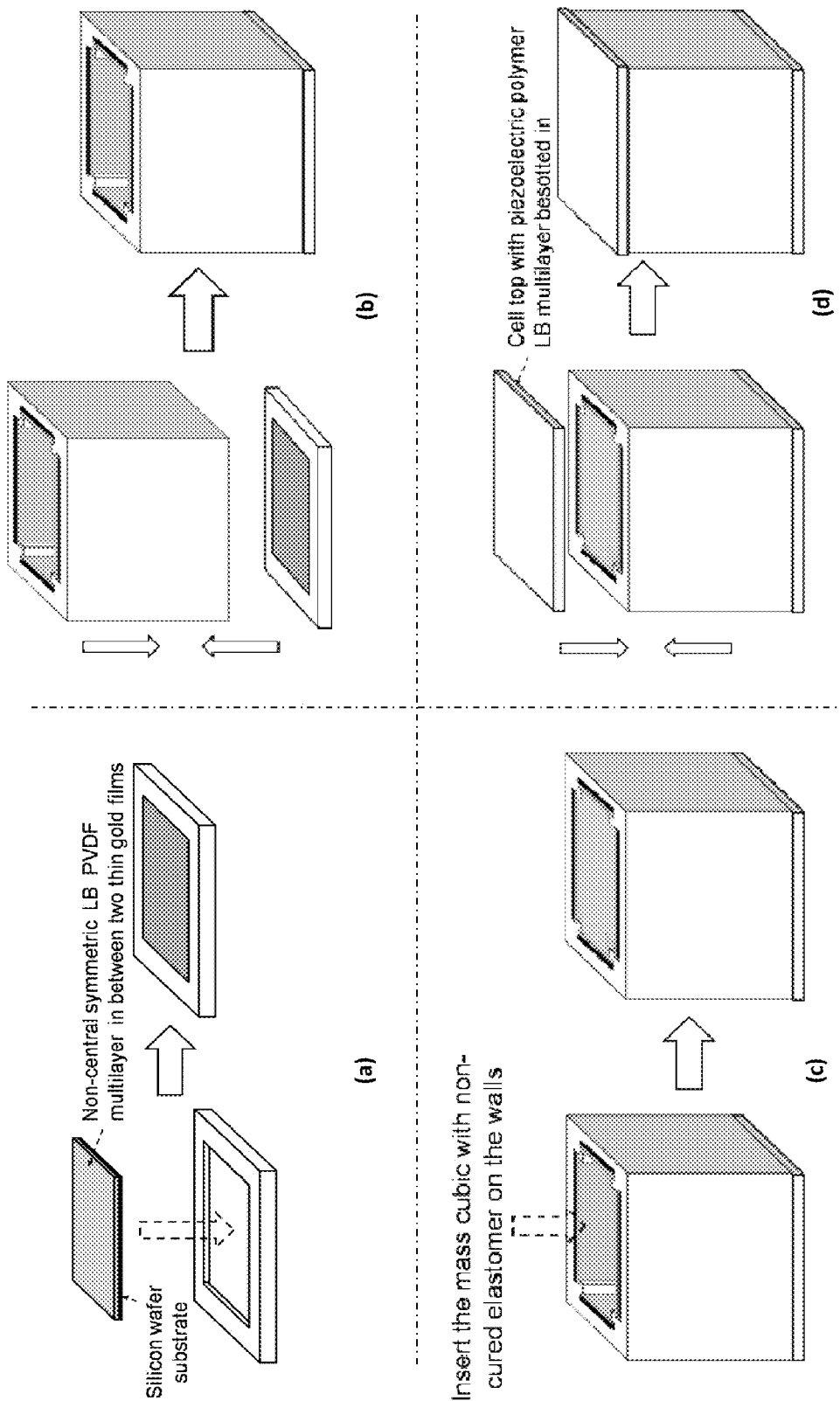
FIG. 9 demonstrates schematically the fabrication and assembly of the cubic converter.

FIG. 9 demonstrates schematically the fabrication and assembly of the cubic converter. After four multi-layer devices are inserted into the cubic walls as shown in FIG. 9, a bottom base is assembled (FIG. 9(b)). The bottom base is made of the same material as the cube wall and includes a mechanically milled groove for holding the sandwich device (FIG. 9(a)). Then, the cubic cell is filled with mass material, such as stainless steel (FIG. 9(c)). The mass cubic walls are coated with non cured polydimethylsiloxane (PDMS). Then the cubic cell is sealed with a top cover using non cured PDMS (FIG. 9(d)). Finally, the entire cube is cured at temperature of 30° for about one hour to allow the PDMS elastomer to be fully polymerized. The top cover is identical to the bottom base and assembled with the multi-layer device as the inside wall.

System Efficiency Evaluation

For simplicity of evaluation, a single cubic cell wall is used as an example because all the cubic walls are identical and the evaluation result should correctly reflect the entire system functionality. FIG. 10(a) is the physical model of the proposed kinetic-to-electric energy conversion device in the single-wall configuration, and FIG. 10(b) is the equivalent circuit corresponding to FIG. 10(a). Generally, the kinetic-to-electric energy conversion efficiency η for this model is expressed as follows:

$$\eta = \frac{1}{2}\frac{k^2}{1-k^2} \bigg/ \left(\frac{1}{Q} + \frac{1}{2}\frac{k^2}{1-k^2}\right) \quad (4)$$

where Q is a quality factor and $k^2$ is an electromechanical factor of the device. Both Q and $k^2$ are related to the intrinsic parameters of the device such as multilayer thickness, cross-sectional area of the sandwich device, clamped capacitance $C_0$, density of the multilayer, mass of heavy stainless steel, and the stiffness of the multilayer. As indicated, the efficiency of the device depends entirely on the quality factor Q and the electromechanical coupling factor $k^2$. So, by adjusting these parameters during the fabrication of system components, an optimal combination of Q and $k^2$ to achieve the high efficiency is obtained. Efficiencies of 94.1% and 90.9% respectively using piezoelectric ceramic and $LiNbO_3$ crystal respectively have been obtained. The non-central symmetric LB PVDF multilayer of the present invention should achieve much higher piezoelectricity output than either ceramic or $LiNbO_3$ crystal as discussed earlier, and hence the resulting efficiency of the proposed devise is estimated at greater than 90%.

Figure 10:
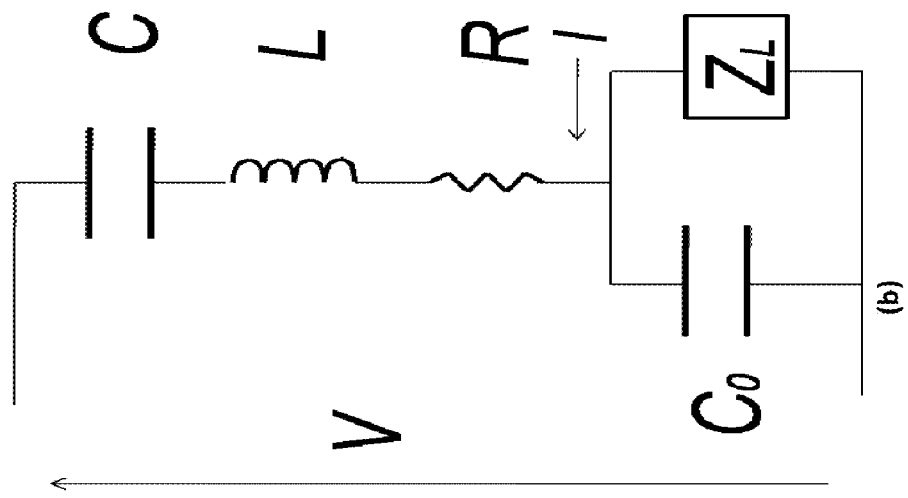
FIG. 10 is the physical model of the proposed kinetic-to-electric energy conversion device in the single-wall configuration and its equivalent circuit.
Figure 10:
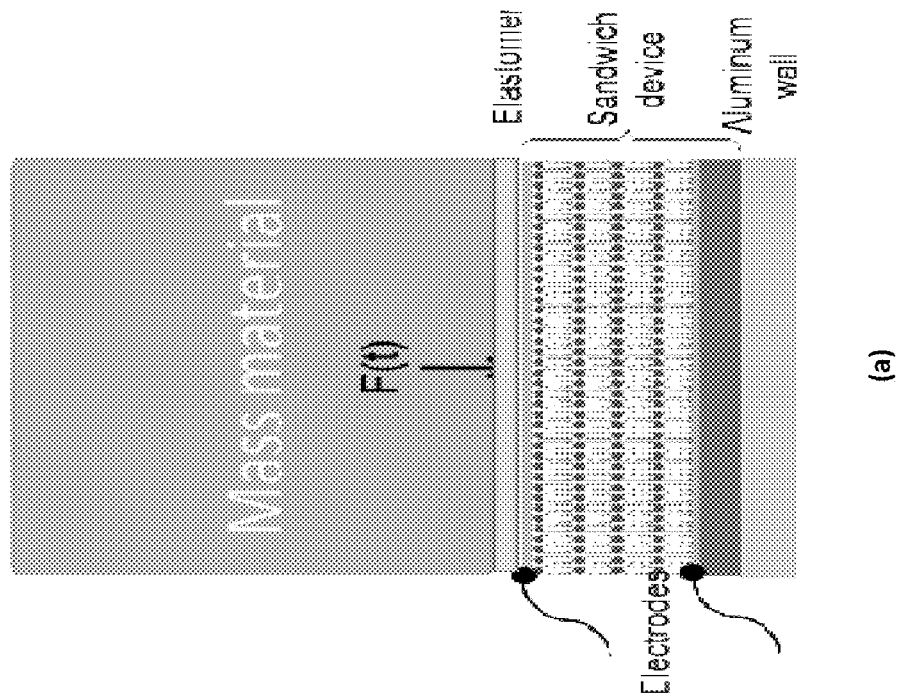

At sea state code 2 ocean wave conditions (relatively calm) and given the dimensions of the system device, kinetic power of 1.24 W to harvest is available. With efficiency of the system >90% based on the data presented above, it generates power >1.16 W. At sea state code 4, the system generates >99.8 W. Given this power value, the first embodiment of the present invention outputs >18 volts and continuously produces 0.2-1.4 AMPS of rechargeable current for storage using suitable series and parallel circuit connections among the individual cubic converters as indicated in FIG. 10.

Hydrodynamic Energy Conversion System

The hydrodynamic energy conversion system uses piezoelectric materials in the walls of each cube cell to generate electric current from the set back forces and pressures exerted on the walls as exerted by the motion a heavy mass (such as stainless steel or other material) filling the interior of the cube. The first embodiment of the invention employs a cell wall material that is specially fabricated using Langmuir-Blodgett (LB) thin film multilayer deposition technology. However, the cell walls may also be constructed using commercially available piezoelectric materials when they are combined and assembled in the manner specified herein. This approach is a second embodiment of the current invention and includes the same system design as the first embodiment except that the internal cubic cell walls are fabricated in a unique manner using commercially available piezoelectric materials, rather than the non-central symmetric LB poly-vinylidene fluoride (PVDF) multilayer piezoelectric material as described in the first embodiment of the present invention.

Figure 12:
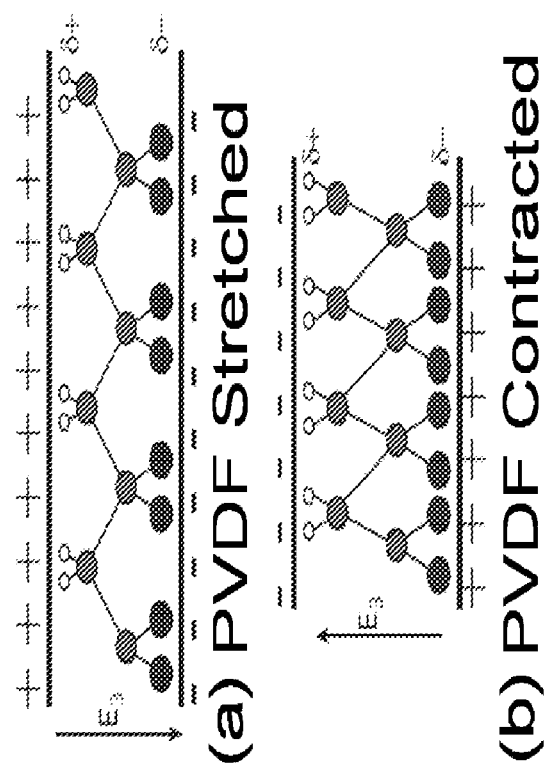
FIG. 12 illustrates that when the PVDF sheet is either stretched or contracted under mechanical pressure, an electric field change across the sheet is generated.

The second embodiment is designed by (1) using alternating layers of poly vinylidene fluoride (PVDF) and a hybrid of poly ethylene dioxythiophene (PEDOT) and poly styrene sulfonate (PSS) in a multilayer configuration to achieve very high piezoelectric current; (2) assembling a unique poly-cubic stack of cells with a stainless steel cube inside each cell as the working proof mass that absorbs the kinetic energy from the hydrodynamic kinetic motion and transmit the force to the PEDOT-PSS piezoelectric cell walls; (3) inserting a flexible elastomeric layer of poly-dimethylsiloxane (PDMS) in the gap between the stainless steel mass and the piezoelectric layers of the cell walls to protect them from any striking forces on the hybrid piezoelectric multilayer; and (4) coupling the poly-cubes to an integrated rechargeable battery with a regulation circuit board. All the necessary components are illustrated in FIG. 12 along with the initial dimensions of the design. The system is designed as an "A" dimension with a diameter of 3.6 inches and thickness of 3.2 inches to fit into the battery compartments of some existing equipment if desired. However, the system may be designed to virtually any dimensions to meet application requirements.

The system's internal cells are connected via a combination of series and parallel circuits that can be configured to accommodate a variety of different voltage and amperage output combinations. As the system moves with the sea waves, tides or flow currents, the acceleration of the heavy proof mass inside each cubic cell effectively creates a setback pressure (inertia force) that in turn applies itself on the inside walls of each small cube cell. Each cube wall is specially fabricated with the hybrid PVDF/PEDOT-PSS multilayer structure to generate high piezoelectric voltage and current. Ample research indicates that the piezoelectric materials will not experience fatigue during many years of continuous operation.

Due to the high density of the heavy stainless steel proof mass and the high elasticity of the elastomeric layer, the dynamic force of the moving mass applies an effective pressure on the interior walls of each cubic cell, and since the friction between the heavy mass and the wall is very small (due to high elasticity of the elastomeric material layer) the transfer of pressure takes place with high efficiency. Since there are a minimum of mechanical moving parts, the assembled device, shown in FIG. 11(c) is easy to fabricate, trouble-free, highly durable and very scalable in size (from a few $cm^3$ to many $m^3$). The piezoelectric polymer PVDF is a much softer and more durable piezoelectric material than inorganic crystals or ceramics, such as quartz and lead zirconate titanate PZT. Hence, it possesses higher sensitivity to low pressure, which is very appropriate for low sea states (code 2 to 4). It also allows for compact design. The piezoelectric effect is highly augmented by introduction of the properly oriented and uniform hybrid PVDF/PEDOT-PSS multilayer, enabling the device to increase its power output by at least two orders of magnitude compared to the device using a single PVDF layer of piezoelectric material. The poly-cubic stack design increases the kinetic-to-electric efficiency by expanding the effective surface area of the piezoelectric multilayer and allows the system to harvest hydrodynamic flow kinetic energy from all directions, thereby enhancing the harvesting efficiency still further.

Figure 11:
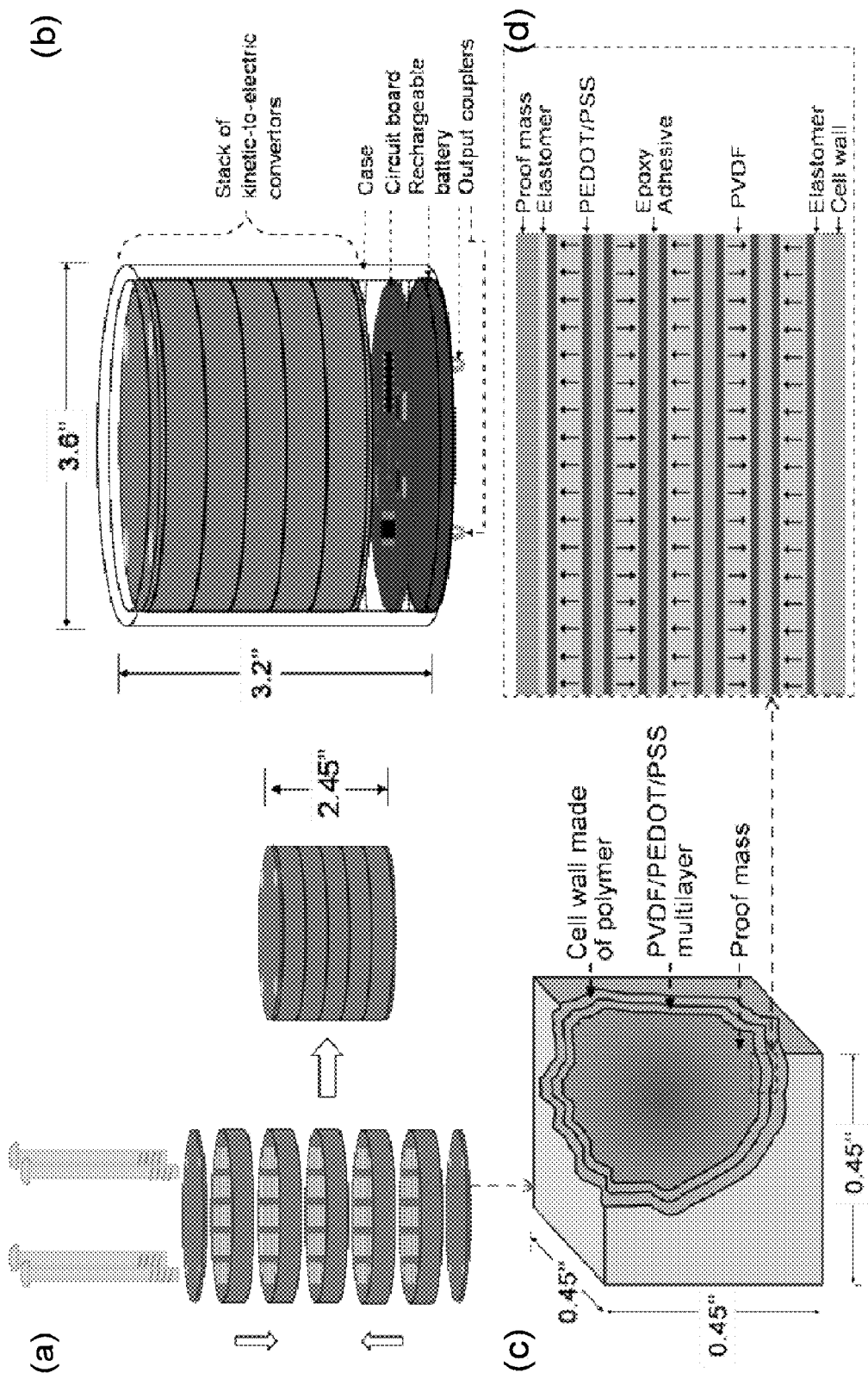
FIG. 11 illustrates the unique poly-cubic stack design with proof mass as the kinetic energy absorber; the system including protection case, poly-cubic stack, current regulation circuit board, rechargeable battery and a output couplers for system integration; the zoom in cut-away of an individual stainless mass cubic-filled kinetic-to-electric conversion cube showing the inside wall made of the hybrid PVDF/PEDOT-PSS multilayer material; and the zoom in sandwich structure of the hybrid PVDF/PEDOT-PSS multilayer.

FIG. 11 illustrates the unique poly-cubic stack design with proof mass as the kinetic energy absorber; (b) the system including protection case, poly-cubic stack, current regulation circuit board, rechargeable battery and a output couplers for system integration; (c) the zoom in cut-away of an individual stainless mass cubic-filled kinetic-to-electric conversion cube showing the inside wall made of the hybrid PVDF/PEDOT-PSS multilayer material; (d) the zoom in sandwich structure of the hybrid PVDF/PEDOT-PSS multilayer.

As in the first embodiment of the present invention, the poly-cubic stack design (1) uniformly disperses the high pressure to many cell walls, resulting in an improvement in system performance and durability even in the event of harsh sea condition; (2) significantly increases the surface area of the piezoelectric material to gain high kinetic-to-electric conversion efficiency; and (3) effectively tunes the output voltage and current for charging a rechargeable battery via a combination of series and parallel connections of the individual piezoelectric cell walls. Because of the combination of the properly oriented and uniform hybrid PVDF/PEDOT-PSS multilayer, the heavy proof mass and the poly-cubic stack design, the system can remain small with characteristics as follows: diameter ≦3.6 inches; thickness ≦3.2 inches; weight <2 lbs; and conversion efficiency >90%. Due to its compact size, robust design, high energy conversion efficiency, and easy scalability to generate needed power levels, the system, for example, is fully capable of powering unmanned propulsion systems or deployable sensors for very long lifetimes to meet many application requirements.

A piezoelectric power generator is well suited for water-borne applications due to the availability of large amounts of hydrodynamic energy for harvesting. Moreover, it is also ideal for applications where power needs to be generated while moving freely in the water, without being fixed to the seabed, as is required with some unmanned propulsion systems, deployed sensors and autonomous underwater vehicles. The size-scalable system not only addresses the need for unmanned system propulsion and deployable sensor operations, but may also impact future deployable sonobuoy designs. In fact, a wide range of applications will benefit from this compact and highly efficient kinetic-to-electric conversion system.

Unlike other kinetic-to-electric conversion systems, most of which employ many mechanical moving parts and require sea bed anchoring systems, the present invention is an extremely compact, adaptable and robust "point absorber" with virtually no moving parts that will be able to harvest hydrodynamic kinetic energy from its continuous floating and bobbing motion.

The proposed system has the following advantages over other approaches:
  Significantly increases kinetic-to-power conversion efficiency (>90% estimate) compared to traditional energy harvesting alternatives that often employ many mechanical moving parts such as turbines, pumps and motors that reduce efficiency due to friction and heat;
  Considerably reduces the dimensions of the entire system providing easy integration as a module into many other systems to replace standard batteries or can be scaled up using plug compatible modules as a stand-alone power source;
  Notably enhances the robustness of the proposed system so that the system can withstand extreme weather conditions and dynamic motion forces from violent storms. In fact, such storms, in some applications may be a welcome source of additional electric power.
  Allows for long system life and low maintenance due to its lack of moving parts and use of highly durable, long-life piezoelectric materials;
  Silent operations with no motor generator or pump noise thereby providing for enhanced operational security and mission stealth when necessary.

These advantages are made possible by the following unique innovations:
  Use of the properly oriented and uniform hybrid PVDF/PEDOT-PSS multilayer as the high efficiency piezoelectric material.
  Integration of a unique poly-cubic stack design with stainless steel cubic mass as the kinetic energy absorber able to harvest energy in all directions of motion.

Piezoelectric Polymer

The use of piezoelectric materials yields significant advantages for power supply systems. The energy density achievable with piezoelectric devices is potentially greater than that possible with electrostatic or electromagnetic devices. Since piezoelectric materials convert mechanical energy into electrical energy via strain in the piezoelectric material, they lend themselves well to devices that operate by bending or flexing which brings significant design advantages.

Piezoelectricity is a property of many non-central symmetric ceramics, polymers and other biological systems. The properties of organic polymers such as PVDF are so different in comparison to inorganic ceramic materials such as PZT (see Table 3) that they are uniquely qualified to fill niche areas where single crystals and ceramics are incapable of performing as effectively. As noted in Table 3, the piezoelectric strain constant ($d_{31}$) for the PVDF polymer is lower than that of the ceramic. However, piezoelectric polymers have much higher piezoelectric stress constants ($g_{31}$) indicating that they are much better kinetic-to-electric converters than ceramics. In addition to their high strength and high impact resistance, piezoelectric polymeric materials also offer the advantage of process flexibility because they are lightweight, tough, readily manufactured into large areas, and can be cut and formed into complex shapes. Other notable features of polymers are their low dielectric constant, low elastic stiffness, and low density, which result in high voltage sensitivity (excellent sensor characteristic), and low acoustic and mechanical impedance (crucial for medical and underwater applications). PVDF Polymers also typically possess a high dielectric breakdown and high operating field strength, which means that they can withstand much higher driving fields than ceramics. PVDF polymers also have excellent resistances to creep and fatigue and offer the ability to pattern electrodes on the film surface, to pole only selected regions. Based on these features, piezoelectric polymers possess their own established domain for technical applications and useful device configurations. For this invention, the piezoelectric polymer PVDF is chosen as the building block materials for the kinetic-to-power conversion application. Alternative polymers can be chosen for other applications.

Because of the aligned ions, there is a charge polarization. When the PVDF sheet is either stretched or contracted under mechanical pressure, an electric field change across the sheet is generated as shown in FIGS. 12(a) and (b). The thickness of the sheet is generally very small (a few tens of microns), but the length is substantial and even an elongation of only a small percent is noticeable. When a mechanical pressure is applied across two sheets that are glued together with opposite polarization (bimorph), the sheets have a much larger piezoelectric effect than an individual sheet. Based on this technology, a hybrid PVDF multilayer, from a few layers to 100 layers, rather than a single-layer piezoelectric material may be developed, which will increase the power output of the device by at least two orders of magnitude.

Conducting Polymers and PEDOT-PSS

Figure 13:
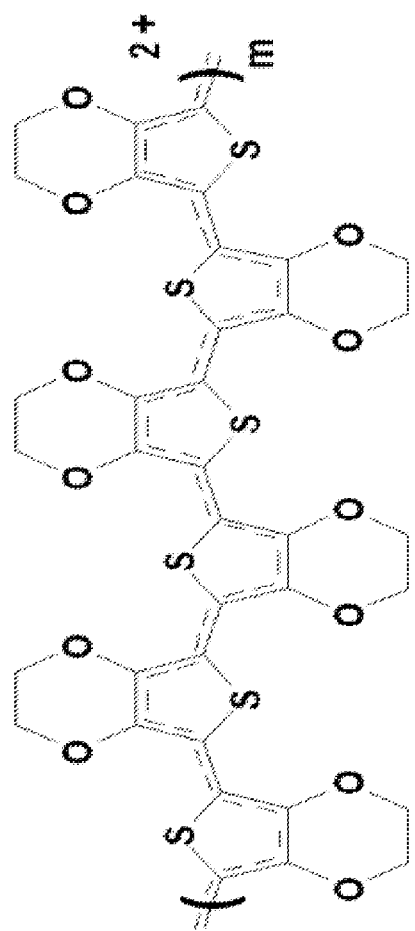
FIG. 13 is the molecular representation of PEDOT-PSS.

In order to output power, the PVDF sheet must have electrodes. In small deformation applications the electrodes may be metal, which is advantageous because it has very high conductivity and the voltage throughout the electrode can be assumed to be uniform. The drawback with metal is that it is stiffer than the PVDF polymer and so hinders its deformation. Conducting polymer electrodes are more flexible. One conducting polymer is PEDOT-PSS. Polyethylene dioxythiophene is a conjugated polymer, and polystyrene sulfonate is a dopant which dramatically increases the conductivity of PEDOT. FIG. 13 is the molecular representation of PEDOT-PSS.

There are several ways to coat the polymer electrodes onto the PVDF sheets. One method that has been attempted is spraying. In this method a spray gun is used to spray liquid PEDOT-PSS onto the surface of the PVDF, which then is allowed to dry. PVDF is hydrophobic, and since PEDOT-PSS comes in a water-diluted form, if the PEDOT-PSS is applied too thickly it beads up. A method that seems to work quite well is inkjet printing. In this method PEDOT-PSS is printed onto the PVDF sheets using an ordinary inkjet printer. The thickness of the applied layers can be easily controlled to produce uniform layers.

Piezoelectric Hybrid PVDF/PEDOT-PSS Multilayer Fabrication Process

Figure 14:
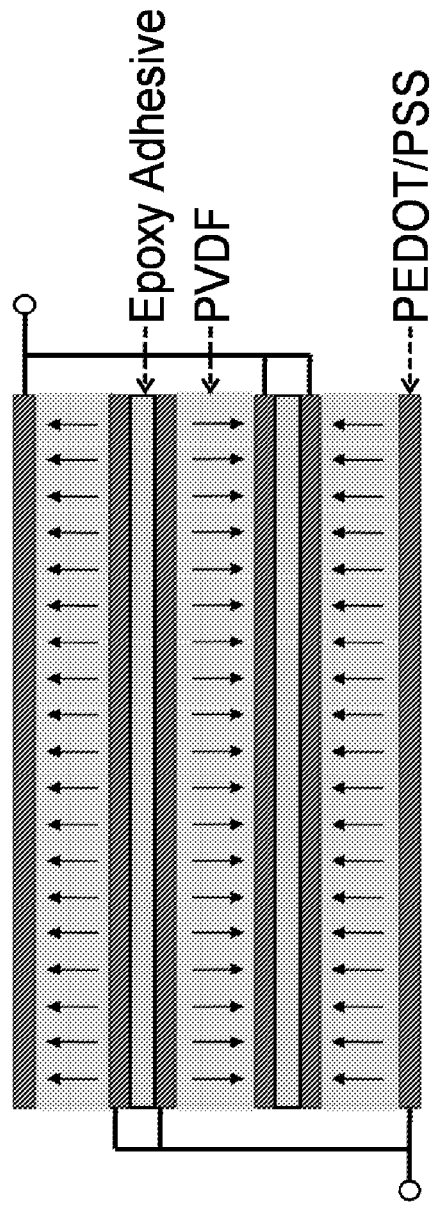
FIG. 14 shows the stacking configuration and electrical connection of a three layer PVDF/PEDOT-PSS hybrid stack.

In order to further improve the piezoelectric sensitivity, single layer PVDF piezoelectric films are properly stacked into a hybrid multi-layer system in such a way that the macroscopic dipoles in the adjacent PVDF film have opposite orientations. It is concluded that stacking in a configuration of parallel energized straight polarity PVDF layers yielded the best central deflection. FIG. 14 shows the stacking configuration and electrical connection of a three layer PVDF/PEDOT-PSS hybrid stack. An attempt is made to compare the performance of a multilayer actuator with an equivalent single thick layer actuator. It is noticed that the multilayer actuator performance was much better when the number of layers is doubled. Table 4 shows the effect of layer thickness in a multilayer actuator stack. It may be observed from the table that for a constant stack thickness of 110 microns, the stack having the higher number of layers with smaller layer thickness yields the better central deflection of the actuator.

TABLE 4

| Stack thickness (μm) | Thickness of each layer (μm) | Number of layers | Central deflection (μm) |
|---|---|---|---|
| 110 | 110 | 1 | 0.0688 |
| 110 | 55 | 2 | 0.1379 |
| 111 | 37 | 3 | 0.2078 |
| 112 | 28 | 4 | 0.2776 |

Figure 15:
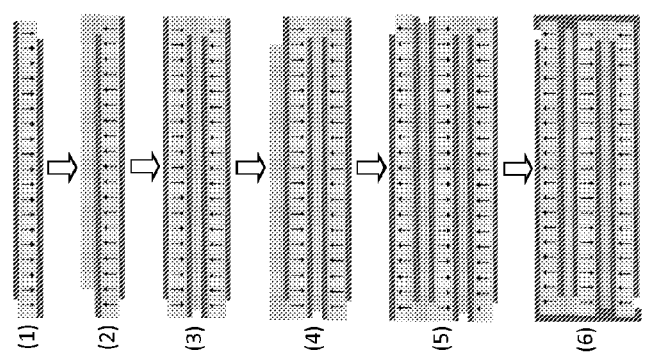
FIG. 15 shows the process of fabricating a three layer hybrid PVDF/PEDOT-PSS material.

This fabrication process is based on the method described in FIG. 15. For simplicity, FIG. 15 only shows the process of fabricating a three layer hybrid PVDF/PEDOT-PSS material. Additional layers (up to a few hundred with thickness of a few millimeters) may be easily obtained by repetition of the process. The more layers that the hybrid PVDF/PEDOT-PSS material has, the higher will be its piezoelectric sensitivity.

The PEDOT-PSS (Baytron P) solution is purchased commercially. The weight ratio of PEDOT to PSS is 1:1.6. In order to obtain highly conducting PEDOT-PSS samples, dimethyl sulfoxide (DMSO) is added into the Baytron P solution at a volume ratio of 4:1 (PEDOT-PSS:DMSO) and stirred for 8 hours at room temperature. The PEDOT-PSS (DMSO) solution is spray coated or screen-printed onto both sides of three PVDF sheets ((β phase, 25 μm, Kynar) in an inter-digital manner as shown in FIG. 15(1). The PVDF sheets are pre-trimmed at a dimension to fit the pre-designed cubic walls. Before screen-printing, the surface of the substrates is modified by using the ion-assisted-reaction (IAR) method. A cold-hollow cathode-type ion source is used for the IAR treatment. The thickness of the PEDOT-PSS layer is controlled to be about 2500 Å, and the film is also modified by the IAR method. The contact angles of de-ionized water and formamide to the PEDOT-PSS are measured by using a contact angle goniometer. The surface morphology of the modified PEDOT-PSS layers is measured by using scanning electron microscopy (SEM). In order to analyze the chemical bonds on the modified PEDOT-PSS (DMSO) surface, X-ray photoelectron spectroscopy (XPS,) experiments are performed. The surface resistance of the PEDOT/PSS layers are measured by using a 4-point probe (SD-520, NAGY) or similar instrument.

An epoxy adhesive (Araldite standard) is screen-printed on the PEDOT-PSS layers. The thickness of the epoxy is about 40 μm as shown in FIG. 15(2). Then bimorph layers with their directions of polarization opposite to each other are fabricated by putting another PEDOT-PSS pre-coated PVDF sheet on top of the epoxy layer, pressing the two PVDF sheets to reduce the thickness of the epoxy layer, fully filling the gap on the right side and leaving a small gape on the left side in between the two PVDF sheets as shown in FIG. 15(3). After being dried for about 1 hour at 70° C., the two sheets are bonded. Repeating steps (2) and (3) on the bimorph layers to keep the layers adjacent with their directions of polarization opposite to each other, we have tri-morph layers as shown in FIG. 15(5). After spray coating on the side of the tri-morph layers, the stacking configuration and electrical connections of the hybrid three layer PVDF/PEDOT-PSS are completed as shown in FIG. 15(6).

The foregoing has been a detailed description of illustrative embodiments of the invention. Various modifications and additions can be made without departing from the spirit and scope if this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Accordingly, this description is meant to be taken only by way of example, and not to otherwise limit the scope of this invention.

What is claimed is:

1. A method for converting ocean wave energy to electric power comprising:

constructing a non-central symmetric Langmuir-Blodgett poly-vinylidene fluoride multilayer piezoelectric material;

using the non-central symmetric Langmuir-Blodgett poly-vinylidene fluoride multilayer piezoelectric material to form a plurality of cube walls in a plurality of cubic cells, wherein each of the cubic cells contains a working mass that absorbs kinetic energy from a hydrodynamic motion of an ocean wave and transmits the hydrodynamic motion to the cube walls;

inserting a flexible elastomeric layer of polydimethylsiloxane or any other elastomers in a gap between the working mass and the cube walls to protect them from a striking force on the non-central symmetric Langmuir-Blodgett poly-vinylidene fluoride multilayer piezoelectric material; and assembling a sea-net containing the plurality of cubic cells.

2. The method for converting ocean wave energy to electric power of claim 1 wherein the working mass is made of stainless steel.

3. The method for converting ocean wave energy to electric power of claim 1 further comprising:
using the motion of the ocean wave to move the sea-net;
accelerating the working mass within the cube walls;
creating an inertia force;
applying the inertia force to the cube walls; and
creating piezoelectric energy.

4. A piezoelectric energy conversion device comprising:
a cube, the cube having a plurality of walls formed from a non-central symmetric Langmuir-Blodgett poly-vinylidene fluoride multilayer piezoelectric material, wherein a interior portion of the cube is filled with a working mass, and wherein a flexible elastomeric layer of polydimethylsiloxane is inserted in a gap between the working mass and the walls of the cube.

5. The piezoelectric energy conversion device of claim 4 wherein the working mass is made of stainless steel.

6. The piezoelectric energy conversion device of claim 4 wherein the cube has a diameter of approximately 3.6 inches and a thickness of approximately 3.2 inches.

7. The piezoelectric energy conversion device of claim 4 wherein the plurality of walls are formed using an alternating layer of poly vinylidene fluoride and a hybrid of poly ethylene dioxythiophene and poly styrene sulfonate in a multilayer configuration.

8. A system for converting ocean wave energy to electric power comprising a plurality of the piezoelectric conversion devices of claim 7, wherein the piezoelectric conversion devices are contained within a plurality of disc frames, wherein the plurality of disc frames are held together with a top cover, a bottom cover, and a plurality of screws; and wherein the disk frames and an electronic circuit board are housed in a protective case.

9. A system for converting ocean wave energy to electric power comprising a plurality of the piezoelectric conversion devices of claim 4, the piezoelectric conversion devices being contained within a plurality of disc frames, and wherein the plurality of disc frames are held together with a top cover, a bottom cover, and a plurality of screws; and wherein the disk frames and an electronic circuit board are housed in a protective case.

10. The system for converting ocean wave energy to electric power of claim 9 further comprising a rechargeable battery.

11. The system for converting ocean wave energy to electric power of claim 10 wherein an AC current generated by the plurality of piezoelectric conversion devices is input to a circuit board to convert and regulate the current for charging a rechargeable battery.

12. The system of claim 9 wherein the cube walls are attached via electrical connections to a circuit board to convert and regulate the electrical current generated by the plurality of piezoelectric conversion devices.

13. The system of claim 9 wherein the piezoelectric material used in the cube cell walls is a single-layer of poly vinylidene fluoride (PVDF) with standard electrodes attached to the surfaces.

14. The system of claim 9 wherein the piezoelectric material used in the cube cell walls is a multi-layer of poly vinylidene fluoride (PVDF) with standard electrodes attached to the surfaces.

15. The system of claim 9 further comprising encapsulating the system components in a protective material having sufficient volume and mass to allow the enclosed system to float on the water surface.

16. A method for converting ocean wave energy to electric power comprising attaching a plurality of the systems of claim 9 together using standard electrical circuitry to form a sea-net wherein the power produced by each system is additive to the other systems.

17. The system of claim 4 wherein the cube walls are connected to an electric circuit board such that the electrical power produced by each piezoelectric cube cell wall is additive to the other cell walls via a combination of series and parallel connections of the individual piezoelectric cell walls.

18. A method for converting ocean wave energy to electric power comprising:
constructing a non-central symmetric Langmuir-Blodgett poly-vinylidene fluoride multilayer piezoelectric material;
using the non-central symmetric Langmuir-Blodgett poly-vinylidene fluoride multilayer piezoelectric material to form a plurality of cube walls in a plurality of cubic cells, wherein each of the cubic cells contains a working mass that absorbs kinetic energy from a hydrodynamic motion of an ocean wave and transmits the hydrodynamic motion to the cube walls;
inserting a flexible elastomeric layer of polydimethylsiloxane or any other elastomers in a gap between the working mass and the cube walls to protect them from a striking force on the non-central symmetric Langmuir-Blodgett poly-vinylidene fluoride multilayer piezoelectric material.

19. A piezoelectric energy conversion device comprising:
a cube, the cube having a plurality of walls formed from a non-central symmetric Langmuir-Blodgett poly-vinylidene fluoride multilayer piezoelectric material, wherein an interior portion of the cube is filled with a working mass, wherein the working mass exerts pressure on the cube walls during motion of the cube and wherein electrical current is generated in the piezoelectric cube walls.

20. A piezoelectric energy conversion device comprising:
a cube, the cube having a plurality of walls formed from a piezoelectric material, wherein the interior portion of the cube is filled with a working mass such that the working mass exerts pressure on the cube walls during motion of the cube thereby generating electrical current in the piezoelectric cube walls.

* * * * *

UNITED STATES PATENT AND TRADEMARK OFFICE
CERTIFICATE OF CORRECTION

| | | |
|---|---|---|
| PATENT NO. | : 8,193,655 B2 | Page 1 of 1 |
| APPLICATION NO. | : 13/044781 | |
| DATED | : June 5, 2012 | |
| INVENTOR(S) | : Weixing Lu and Allan Roberts | |

It is certified that error appears in the above-identified patent and that said Letters Patent is hereby corrected as shown below:

Title page, item (76) Inventors: should read as follows: Weixing Lu, Los Angeles, CA. (US)
Allan Roberts, Buena Park, CA. (US)

Signed and Sealed this
Fourth Day of September, 2012

David J. Kappos
*Director of the United States Patent and Trademark Office*